(12) United States Patent  
Zhu

(10) Patent No.: US 9,129,798 B1  
(45) Date of Patent: Sep. 8, 2015

(54) METHODS OF FORMING SEMICONDUCTOR STRUCTURES COMPRISING ALUMINUM OXIDE

(71) Applicant: Micron Technology, Inc., Boise, ID (US)

(72) Inventor: Difeng Zhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/184,452

(22) Filed: Feb. 19, 2014

(51) Int. Cl.
| | |
|---|---|
| *H01L 21/02* | (2006.01) |
| *H01L 21/3213* | (2006.01) |
| *H01L 21/033* | (2006.01) |
| *H01L 29/51* | (2006.01) |
| *H01L 21/28* | (2006.01) |

(52) U.S. Cl.  
CPC ...... *H01L 21/02178* (2013.01); *H01L 21/0206* (2013.01); *H01L 21/02186* (2013.01); *H01L 21/02205* (2013.01); *H01L 21/02334* (2013.01); *H01L 21/0334* (2013.01); *H01L 21/28158* (2013.01); *H01L 21/28194* (2013.01); *H01L 21/32134* (2013.01); *H01L 29/511* (2013.01); *H01L 29/517* (2013.01)

(58) Field of Classification Search  
CPC ............... H01L 21/02107; H01L 21/02172; H01L 21/02175; H01L 21/02178; H01L 21/02186; H01L 21/02057; H01L 21/0206; H01L 21/02334; H01L 21/28158; H01L 21/28194; H01L 21/3213; H01L 21/32134; H01L 21/31616  
See application file for complete search history.

(56) References Cited

U.S. PATENT DOCUMENTS

| | | | |
|---|---|---|---|
| 7,592,678 | B2 | 9/2009 | Li |
| 7,598,142 | B2 | 10/2009 | Ranade et al. |
| 8,530,974 | B2 | 9/2013 | Cheng et al. |
| 8,536,654 | B2 | 9/2013 | Chambers et al. |
| 2007/0098892 | A1* | 5/2007 | Chung et al. ............... 427/248.1 |
| 2008/0113160 | A1 | 5/2008 | Fernandez et al. |
| 2008/0272438 | A1 | 11/2008 | Doris et al. |
| 2013/0154019 | A1 | 6/2013 | Ando et al. |

OTHER PUBLICATIONS

Chou et al., Imprint of Sub-25 nm Vias and Trenches in Polymers, Appl. Phys. Lett., vol. 67, No. 21, Nov. 20, 1995, pp. 3114-3116.

* cited by examiner

*Primary Examiner* — Thanhha Pham  
(74) *Attorney, Agent, or Firm* — TraskBritt

(57) ABSTRACT

A semiconductor structure comprising aluminum oxide. The semiconductor structure comprises a dielectric material overlying a substrate. The aluminum oxide overlies the dielectric material in a first region of the structure. A second region of the structure includes a first titanium nitride portion overlying the dielectric material, magnesium over the first titanium nitride portion, and a second titanium nitride portion over the magnesium. Methods of forming the semiconductor structure including aluminum oxide are also disclosed.

20 Claims, 7 Drawing Sheets

METHODS OF FORMING SEMICONDUCTOR STRUCTURES COMPRISING ALUMINUM OXIDE

FIELD

Embodiments disclosed herein relate to semiconductor structures including aluminum oxide and methods of forming such semiconductor structures. More specifically, embodiments disclosed herein relate to the semiconductor structures and to methods for forming semiconductor structures comprising self-aligned aluminum oxide structures.

BACKGROUND

Fabrication of conventional semiconductor structures requires forming aligned features within the semiconductor structure. Frequently, photolithography or other lithographic techniques are used to form the aligned features within the semiconductor structure. However, as the number of patterning and photolithography acts increases, the processing time and cost of fabricating the semiconductor structure, as well as the potential for contamination and structural defects, increases. Accordingly, reducing the number of patterning steps is often a goal of semiconductor fabrication methods.

It may be desired to form aluminum oxide at select locations of a semiconductor structure. FIG. 1A illustrates a semiconductor structure 100 at an intermediate processing stage. Aluminum oxide 116 may be formed over a substrate 110 including isolation regions 112. While the aluminum oxide 116 is only desired at a specific location (see FIG. 1C), the aluminum oxide 116 is initially formed over the entire substrate 110 and portions subsequently removed. Additional semiconductor materials 114 may be formed between the aluminum oxide 116 and the substrate 110. A bottom anti-reflective coating (BARC) 140 and a photoresist 150 may be formed over the aluminum oxide 116. Referring to FIG. 1B, portions of the photoresist 150 and the BARC 140 may be removed to produce a desired pattern, which is transferred to the aluminum oxide 116. Referring to FIG. 1C, the aluminum oxide 116 may be removed through the patterned photoresist 150 and BARC 140. However, removing the aluminum oxide 116 may result in undesired damage to exposed materials of the semiconductor structure 100. For example, etching aluminum oxide 116 often requires aggressive etch chemistries that may damage materials of the semiconductor structure 100, such as a dielectric material or a gate oxide. As an example, aluminum oxide may be removed by etching with a solution of ammonium hydroxide, hydrogen peroxide, and water. The ammonium hydroxide and hydrogen peroxide may have concentrations up to about thirty weight percent (30 wt. %). Aluminum oxide may also be removed with etchants such as $Br_2$ in a methanol solution, or with etchants including strong acids such as HF, HCl, phosphoric acid, sulfuric acid, and combinations thereof. The etch chemistries may also undercut the aluminum oxide 116 in regions where the aluminum oxide 116 is desired. Because of the aggressive nature of such etchants, it may be difficult to control the thickness of the aluminum oxide and to prevent damage to materials of the semiconductor structure 100, such as materials underlying the aluminum oxide. Thus, forming aluminum oxide in desired locations on a semiconductor structure is a challenge.

Therefore, it would be desirable to have a method of forming a self-aligned aluminum oxide material without damaging the materials proximate to the aluminum oxide or undercutting the aluminum oxide. It would also be desirable to be able to form a self-aligned aluminum oxide material that does not require etching aluminum oxide and does not require a wet BARC and photoresist material.

DETAILED DESCRIPTION

Figure 1A:
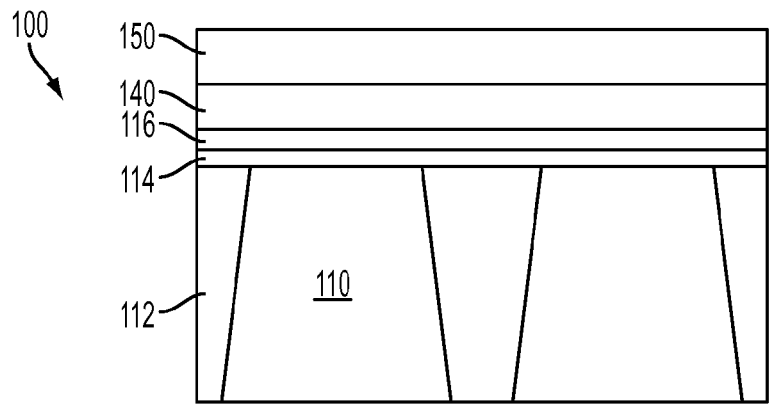
FIG. 1A through FIG. 1C are simplified cross-sectional views showing processing acts for faulting an aluminum oxide material on desired locations of a substrate.
Figure 1B:
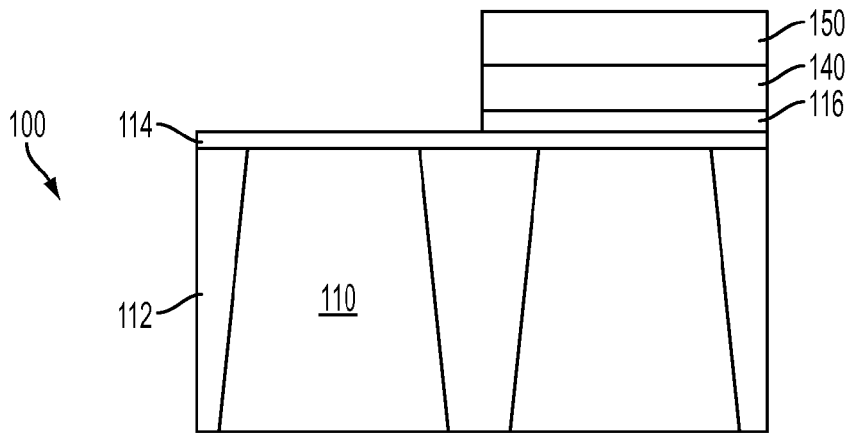
Figure 1C:
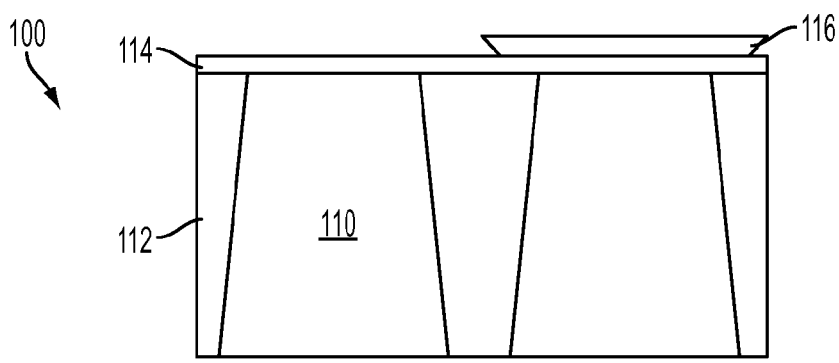

The illustrations included herewith are not meant to be actual views of any particular systems or memory structures, but are merely idealized representations that are employed to describe embodiments described herein. Elements and features common between figures may retain the same numerical designation except that, for ease of following the description, for the most part, reference numerals begin with the number of the drawing on which the elements are introduced or most fully discussed.

The following description provides specific details, such as material types, material thicknesses, and processing conditions, in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete process flow for manufacturing semiconductor structures, and the structures described below do not form a complete semiconductor device. Only those process acts and structures necessary to understand the embodiments described herein are described in detail below. Additional acts to form a complete semiconductor device including the structures described herein may be performed by conventional techniques.

Methods of forming an aluminum-containing material on a semiconductor structure are disclosed, as are semiconductor structures including aluminum oxide. The aluminum-containing material may be formed by atomic layer deposition (ALD), chemical vapor deposition (CVD), plasma enhanced chemical vapor deposition (PECVD), low pressure chemical vapor deposition (LPCVD), physical vapor deposition (PVD), or other film deposition processes. In some embodiments, the aluminum-containing material is formed by ALD. Depending on the material over which the aluminum-containing material is initially formed, the aluminum-containing material may be aluminum oxide or a metal-aluminum compound. In some embodiments disclosed herein, the aluminum-containing material formed over a metal nitride material may form an aluminum-containing metal compound including aluminum, the metal, oxygen, and nitrogen. As used herein, the term "metal-aluminum compound" refers to a compound including aluminum, the metal over which the aluminum-containing material is formed, oxygen, and nitrogen atoms. The metal-aluminum compound is a reaction product of the aluminum, metal, oxygen, and nitrogen. The aluminum-containing material formed over other materials of the semiconductor structures may be aluminum oxide. Thus, the aluminum-containing material formed over the metal nitride may have a different composition than the aluminum-containing material formed over a different material, such as silicon, silicon dioxide, a high-k dielectric material, or other material. The metal-aluminum compound and the aluminum oxide may exhibit a different etch selectivity to various etchants, enabling the metal-aluminum compound to be selectively removed from the semiconductor structure. In some embodiments, the metal-aluminum compound is formed over a titanium nitride material.

Figure 2:
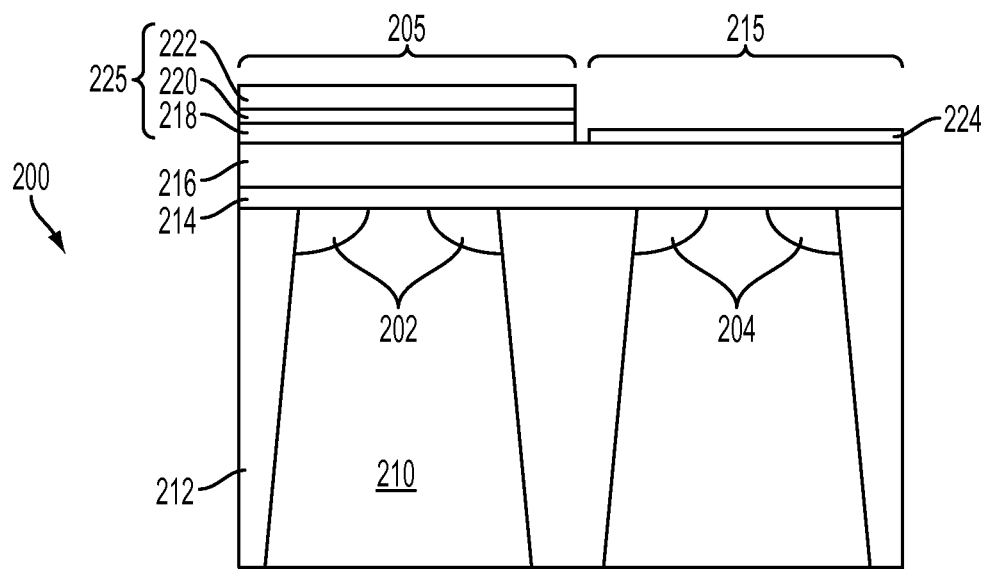
FIG. 2 is a simplified cross-sectional view showing a semiconductor structure with an aluminum oxide material according to embodiments of the present disclosure.

Referring to FIG. 2, a semiconductor structure 200 is shown. The semiconductor structure 200 includes a substrate 210 that may include isolation regions 212. Isolation regions 212 may be shallow trench isolation regions formed of a dielectric material, such as silicon dioxide. The substrate 210 may be a base material or construction upon which additional materials are formed. The substrate 210 may be a semiconductor substrate, a base semiconductor layer on a supporting structure, a metal electrode or a semiconductor substrate having one or more layers, structures or regions formed thereon. The substrate 210 may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

The semiconductor structure 200 may include at least two regions, such as region 205 and region 215. Although only one region 205 and one region 215 is shown in FIG. 2, the semiconductor structure 200 may include several alternating portions of region 205 and region 215. Region 205 may, for example, include an n-type channel, such as an NMOS transistor having an n-channel, and region 215 may, for example, include a p-type channel, such as a PMOS transistor having a p-channel in a complementary-metal-on-semiconductor (CMOS) structure. For convenience, region 205 is also referred to herein as the n-channel region 205 and region 215 is also referred to herein as the p-channel region 215. By way of example, n-channel region 205 may also include n-doped source and drain regions 202, and p-channel region 215 may include p-doped source and drain regions 204. As explained in more detail below, only p-channel region 215 may include aluminum oxide 224.

N-channel region 205 of the semiconductor structure 200 may include a gate oxide 214 overlying the substrate 210. The gate oxide 214 may include an oxide, such as a deposited or a thermally grown silicon dioxide material. A high-k dielectric material 216 may overlie the gate oxide 214. Non-limiting examples of high-k dielectric material 216 include, but are not limited to, hafnium oxide (such as, for example, $HfO_2$), titanium oxide (such as, for example, $TiO_2$), tantalum oxide (such as, for example, $Ta_2O_5$), zirconium oxide (such as, for example, $ZrO_2$), niobium oxide (such as, for example, NbO, $NbO_2$, or $Nb_2O_5$), molybdenum oxide (such as, for example, $MoO_2$ or $MoO_3$), ruthenium oxide ($RuO_2$), strontium oxide (such as, for example, SrO), barium oxide (such as, for example, BaO), strontium titanium oxide ($SrTiO_3$, also known as STO), magnesium oxide (such as, for example, MgO), or combinations thereof.

A gate stack 225 may overlie the high-k dielectric material 216. The gate stack 225 may include a first metal material 218, a capping material 220, and a second metal material 222. The first metal material 218 and the second metal material 222 may be formed of the same metal or different metals. The first metal material 218 may be selected to provide adhesion to the underlying high-k dielectric material 216. In some embodiments, each of the first metal material 218 and the second metal material 222 is a metal nitride, such as titanium nitride. However, in other embodiments, the first metal material 218 may include copper, tungsten, aluminum, titanium, tantalum, ruthenium, platinum, alloys thereof, nitrides thereof, heavily doped semiconductor material, a conductive silicide, or combinations thereof, and the second metal material may include a metal nitride.

P-channel region 215 may include the gate oxide 214 overlying the substrate 210 and the high-k dielectric material 216 overlying the gate oxide 214. The gate oxide 214 and the dielectric material 216 in p-channel region 215 may be the same as those in n-channel region 205. Aluminum oxide 224 may overlie the high-k dielectric material 216. The aluminum oxide 224 may increase the work function of the gate in region 215. The aluminum oxide 224 may be located only in p-channel region 215 of the semiconductor structure 200.

Accordingly, a semiconductor structure comprising an aluminum oxide material is disclosed. The semiconductor structure comprises a dielectric material overlying a substrate. The structure includes a first region comprising aluminum oxide overlying the dielectric material. The semiconductor structure includes a second region comprising a first titanium nitride portion overlying the dielectric material, magnesium over the first titanium nitride portion, and a second titanium nitride portion overlying the magnesium.

Figure 3A:
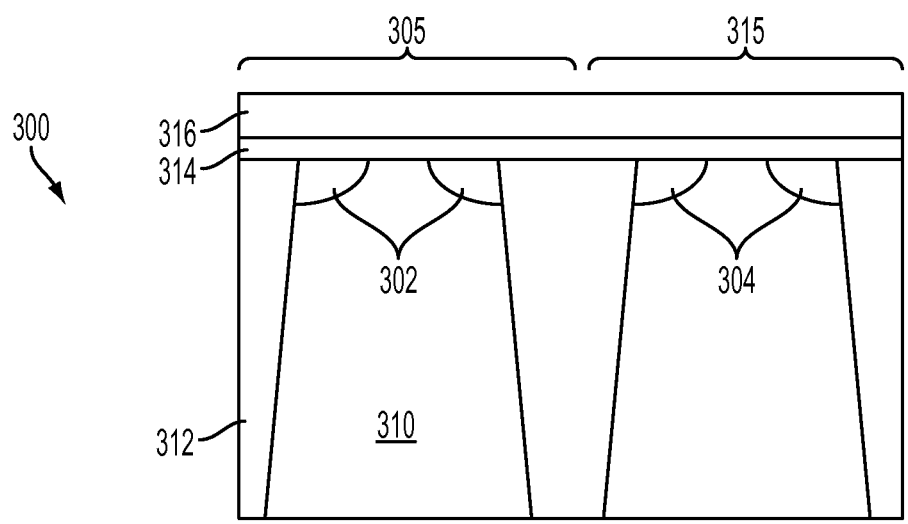
FIG. 3A through FIG. 3F are simplified cross-sectional views showing processing acts for forming the semiconductor structure of FIG. 2 according to some embodiments of the present disclosure.

A method of faulting a semiconductor structure 300 including an aluminum oxide material is described with reference to FIG. 3A through FIG. 3F. Referring to FIG. 3A, isolation regions 312 may be formed in a substrate 310 by conventional techniques, which are not described in detail herein. A gate oxide material 314 may be formed over the substrate 310. The gate oxide material 314 may be thermally grown or may be deposited, and may include a material such as silicon dioxide. While not shown, other materials may, optionally, intervene between the substrate 310 and the gate oxide material 314 depending on the desired application of the semiconductor structure 300. The substrate 310 may include source and drain regions. For example, n-channel region 305 of the substrate 310 may include n-doped source and drain regions 302 and p-channel region 315 may include p-doped source and drain regions 304 located adjacent the isolation regions 312. Source and drain regions 302 may be formed by doping the semiconductor substrate 310 with n-type dopants, such as boron, as known in the art. Source and drain regions 304 may be formed by doping the semiconductor substrate 310 with p-type dopants, such as phosphorus, as known in the art.

A dielectric material 316 may be formed over the gate oxide material 314. The dielectric material 316 may be a dielectric material such as a silicon oxide or a high-k dielectric material similar to high-k dielectric material described above with reference to high-k dielectric material 216. In some embodiments, the dielectric material 316 is hafnium oxide. The dielectric material 316 may be formed by ALD, CVD, PECVD, LPCVD, PVD, or other film deposition processes.

Figure 3B:
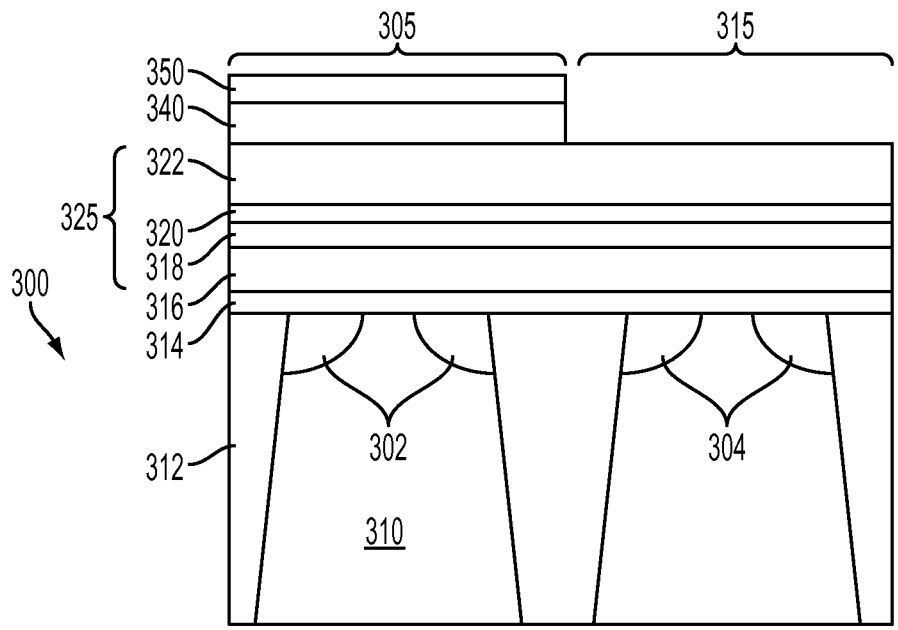

Referring to FIG. 3B, a first metal material 318 may be formed over the dielectric material 316. The first metal material 318 may be selected to provide adhesion to the dielectric material 316. In some embodiments, the first metal material 318 is a metal nitride, such as titanium nitride. The first metal material 318 may have a thickness of between about 10 angstroms (Å) and about 30 Å, such as between about 15 Å and about 25 Å. In some embodiments, the first metal material 318 has a thickness of about 20 Å.

A capping material 320 may overlie the first metal material 318. The capping material 320 may include a metal such as magnesium, magnesium oxide, lanthanum, lanthanum oxide, or combinations thereof. In some embodiments, the capping material 320 is magnesium. The capping material 320 may be selected to provide a decreased work function of the NMOS device in n-channel region 305. The capping material 320 may be formed to a thickness of between about 5 Å and about 15 Å, such as between about 5 Å and about 10 Å. In some embodiments, the capping material 320 has a thickness of about 8 Å. The capping material 320 may be formed by ALD, CVD, PECVD, LPCVD, PVD, or other deposition processes.

A second metal material 322 may be formed over the capping material 320. The second metal material 322 may be formed of the same metal as the first metal material 318. In some embodiments, the second metal material 322 is titanium nitride. In other embodiments, the second metal material 322 may include a lower portion foiined of a metal material or metal nitride and an exposed portion formed of a metal nitride. For example, in some embodiments, a lower portion of the second metal material 322 is a metal material and an exposed portion of the second metal material 322 is titanium nitride.

The second metal material 322 may be formed to a greater thickness than the first metal material 318. The second metal material 322 may have a thickness of between about 20 Å and about 60 Å, such as between about 30 Å and about 50 Å, or between about 35 Å and about 45 Å. In some embodiments, the second metal material 322 has a thickness of about 40 Å. The second metal material 322 may be formed by similar methods as the first metal material 318. For example, the second metal material 322 may be formed by ALD, CVD, PECVD, LPCVD, PVD, or other suitable deposition process. As described in more detail below, the first metal material 318, capping material 320, and second metal material 322 may form a gate stack 325 in the n-channel region 305.

A mask material 340 and a photoresist material 350 may be formed over the semiconductor structure 300 and patterned to expose the second metal material 322 in the p-channel region 315 of the semiconductor structure 300. The mask material 340 may include a hardmask material or other suitable masking material and may have a thickness of about 15 nm. In some embodiments, the mask material 340 is a silicon nitride hardmask. The photoresist material 350 may be any conventional photoresist material. The mask material 340 and photoresist material 350 may be patterned by conventional techniques, which are not described in detail herein.

Figure 3C:
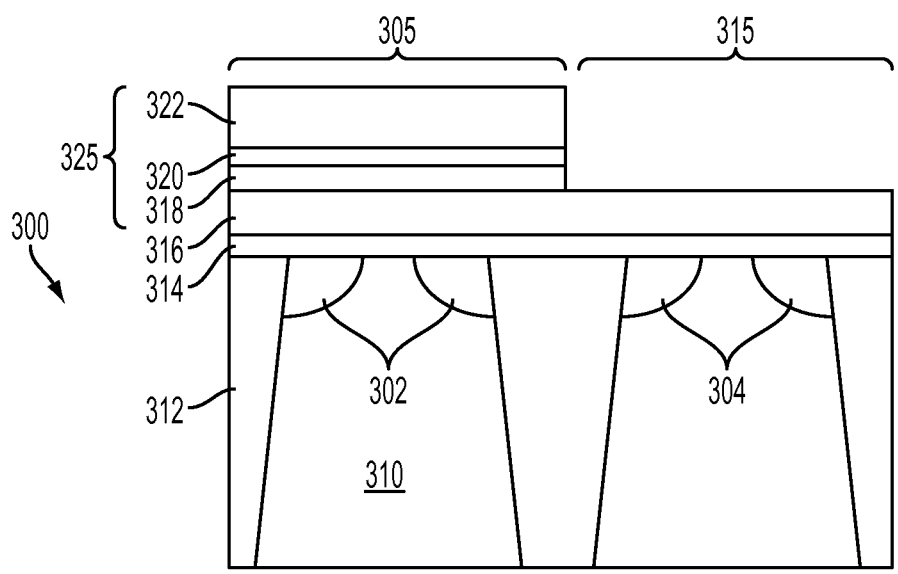

Referring to FIG. 3C, the second metal material 322, the capping material 320, and the first metal material 318 may be removed from the p-channel region 315 by reactive ion etching, such as with an oxygen or a nitrogen based plasma. The plasma may be, for example, a mixture including nitrogen, boron trichloride, and argon ($N_2/BCl_3/Ar$), a mixture including nitrogen, methane, and argon ($N_2/CH_4/Ar$), or a mixture including oxygen, chlorine, and helium, ($O_2/Cl_2/He$). In other embodiments, the second metal material 322, the capping material 320, and the first metal material 318 in the p-channel region 315 may be removed with a solution including ammonium hydroxide ($NH_4OH$), hydrogen peroxide ($H_2O_2$), and water. The mask material 340 and photoresist material 350 may protect the materials of the n-channel region 305 from being removed. The etchant may be nonreactive with the dielectric material 316 and, therefore, the dielectric material 316 may function as an etch stop. The dielectric material 316 of p-channel region 315 may be exposed after removing the second metal material 322, the capping material 320, and the first metal material 318.

After the dielectric material 316 of p-channel region 315 is exposed, the photoresist material 350 and mask material 340 may be removed from n-channel region 305 to expose the second metal material 322 of n-channel region 305. Prior to removing the mask material 340, the dielectric material 316 may be crystallized to increase the etch selectivity of the mask material 340 relative to the dielectric material 316. For example, the dielectric material 316 may be annealed to crystallize the dielectric material 316. Thereafter, the mask material 340 may be removed from n-channel region 305 without substantially removing the dielectric material 316 exposed in p-channel region 315. After removing the mask material 340, the second metal material 322 may be exposed in the n-channel region.

Figure 3D:
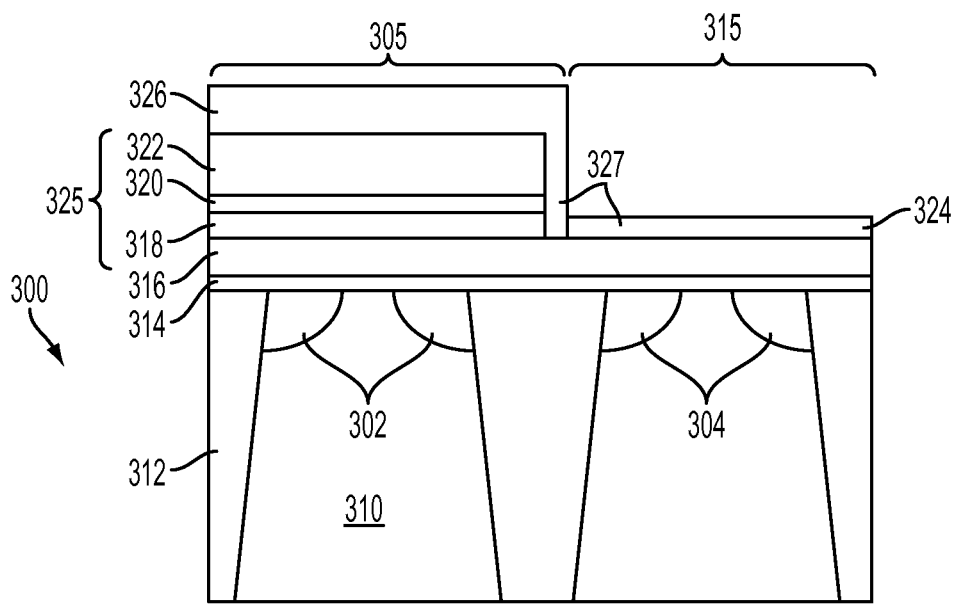

Referring to FIG. 3D, an aluminum-containing material 327 may be formed over exposed surfaces of the semiconductor structure 300. By way of example, the aluminum-containing material 327 may be conformally formed over the dielectric material 316 of p-channel region 315 and over the second metal material 322 of n-channel region 305. As explained in more detail below, the aluminum-containing material 327 may be formed by conventional techniques, such as by an ALD process, a CVD process, a PECVD process, an LPCVD process, a PVD process, or other deposition process, using appropriately selected aluminum precursors and oxygen precursors.

As a result of the conditions used to form the aluminum-containing material 327, such as, for example, deposition temperature, the aluminum-containing material 327 may form as an aluminum oxide 324 on the dielectric material 316 of p-channel region 315 and as a metal-aluminum compound 326 on the second metal material 322 of n-channel region 305. Without being bound by any theory, it is believed that the aluminum of the aluminum-containing material 327 formed on the second metal material 322 may react with the metal of the second metal material 322, forming the metal-aluminum compound 326. In some embodiments, the metal-aluminum compound 326 may also form on the sidewalls of the gate stack 325 where the first metal material 318 and the second metal material 322 are exposed. The metal-aluminum compound 326 may be a reaction product of aluminum from the aluminum-containing material 327, the metal from the second metal material 322, oxygen from the aluminum-containing material 327, and nitrogen from the second metal material 322. In some embodiments, the second metal material 322 is titanium nitride. Thus, the metal-aluminum compound 326 may include aluminum, titanium, nitrogen, and oxygen atoms. In some embodiments, the aluminum compound 326 is a material such as $AlTiO_xN_y$, where x is between one (1) and four (4) and y is between one-half (½) and two (2). In other embodiments, x is about 2.5 and y is about 0.8. The metal-aluminum compound 326 may include about nineteen atomic percent (19 at. %) of each of aluminum and titanium, about forty-seven atomic percent (47 at. %) of oxygen, and about fifteen atomic percent (15 at. %) of nitrogen.

Thus, exposing the semiconductor substrate 300 to the aluminum precursor and the oxygen precursor may form different aluminum-containing materials on n-channel region 305 and p-channel region 315 of the semiconductor structure 300. Aluminum oxide 324 may be formed on p-channel region 315 and the metal-aluminum compound 326 may be foimed on n-channel region 305 of the semiconductor structure 300.

The aluminum oxide 324 and the metal-aluminum compound 326 may be foiined by exposing the semiconductor structure 300 to the aluminum precursor and the oxygen precursor. The aluminum oxide 324 and the metal-aluminum compound 326 may be foiined by a deposition process including an aluminum precursor and an oxygen precursor. The aluminum precursor may include tris(diethylamino) aluminum (TDEAA), alkyl aluminum precursors such as trimethyl aluminum (TMA), aluminum alkoxides such as aluminum isopropoxide (AIP), aluminum tri-sec-butoxide (ATSB), aluminum ethoxide, dimethylaluminumhydride (DMAH), aluminum tris(2,2,6,6-tetramethyl-3,5-heptanedionate), triisobutylaluminum (TIBA), tris(dimethylamido) aluminum (III), or combinations thereof. The oxygen precursor may include oxygen ($O_2$), ozone ($O_3$), water, or combinations thereof. In some embodiments, the aluminum precursor is TMA and the oxygen containing precursor is water.

In some embodiments, the aluminum-containing material may be formed by ALD. The aluminum-containing material 327 may be formed by performing between one ALD cycle and ten ALD cycles. For example, between one ALD cycle and five ALD cycles or between five ALD cycles and ten ALD cycles may be performed. The aluminum oxide 324 may be formed to a thickness of between about 5 Å and about 10 Å, such as between about 5 Å and about 8 Å. The metal-aluminum compound 326 may be formed to a greater thickness than the aluminum oxide 324. Without being bound by any theory, it is believed that the thickness of the metal-aluminum compound 326 may be greater than the thickness of the aluminum oxide 324 because of the incorporation of the second metal material 322 and nitrogen in the metal-aluminum compound 326.

The deposition process may be performed at a temperature from between about 200° C. and about 400° C., such as between about 250° C. and about 350° C. In some embodiments, the deposition is performed at a temperature of about 300° C., which enhances the formation of the metal-aluminum compound 326 over the second metal material 322.

With continued reference to FIG. 3D, the aluminum oxide 324 may be formed only in p-channel region 315 and the metal-aluminum compound 326 may be formed only in n-channel region 305 of the semiconductor structure 300. Thus, the aluminum oxide 324 may be selectively formed over only the dielectric material 316 of p-channel region 315. Although the metal-aluminum compound 326 and the aluminum oxide 324 are formed concurrently, the composition of the metal-aluminum compound 326 may be different than the composition of the aluminum oxide 324. Since the aluminum oxide 324 only forms over the dielectric material 316 and the metal-aluminum compound 326 only forms over the second metal material 322, the formation of the different aluminum-containing materials may be self-aligned on the respective regions of the semiconductor structure 300.

Figure 3E:
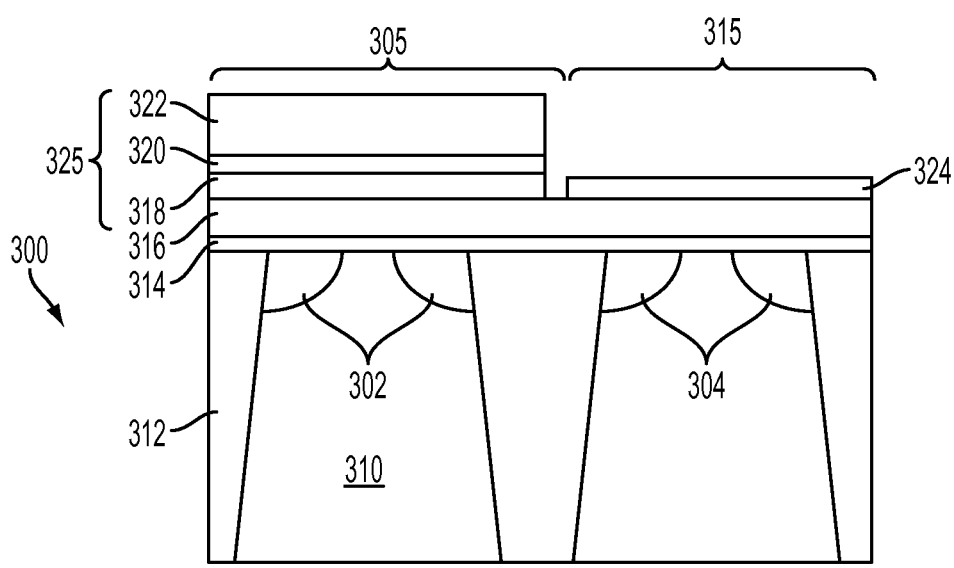

Referring to FIG. 3E, after the aluminum oxide 324 and the metal-aluminum compound 326 are formed, the metal-aluminum compound 326 may be selectively removed from the semiconductor structure 300 such that only the aluminum oxide 324 of the aluminum-containing material 327 (FIG. 3D) remains in p-channel region 315 of the semiconductor structure 300.

The aluminum oxide 324 and the metal-aluminum compound 326 may exhibit different etch rates when exposed to various etchants. For example, the metal-aluminum compound 326 may be removed using an aqueous solution of $H_2O_2$, whereas the aluminum oxide 324 may exhibit a low removal rate upon exposure to the aqueous $H_2O_2$ solution. By way of example only, the metal-aluminum compound 326 may have an etch rate that is at least about 10 times greater than that of the aluminum oxide 324 when exposed to the $H_2O_2$ solution. Thus, the metal-aluminum compound 326 may be removed by exposing the semiconductor structure 300 to $H_2O_2$. However, exposing the aluminum oxide 324 to the $H_2O_2$ solution may not remove any or may remove only a small portion of the aluminum oxide 324. Because the aluminum oxide 324 is not removed by exposure to the $H_2O_2$ solution, the aluminum oxide 324 may also protect underlying materials from being damaged by the $H_2O_2$ solution. The $H_2O_2$ solution may also clean the surface of the semiconductor structure 300 prior to forming additional materials thereover.

The metal-aluminum compound 326 may be removed at a rate of approximately 50 Å per minute when exposed to the $H_2O_2$ solution. Thus, an metal-aluminum compound 326 having a thickness of between about 10 Å and about 20 Å may be removed by exposing the metal-aluminum compound 326 to the $H_2O_2$ solution for less than approximately one minute, such as less than about thirty seconds. In some embodiments, the semiconductor structure 300 is exposed to a solution of $H_2O_2$ for a period of time ranging from between about ten seconds to about three minutes, such as between about thirty seconds and about one minute, or between about one minute and about two minutes. In some embodiments, the semiconductor structure 300 is exposed to an $H_2O_2$ solution for about one minute to substantially remove the metal-aluminum compound 326 while the aluminum oxide 324 remains in p-channel region 315.

The $H_2O_2$ solution may be formed of $H_2O_2$ and water. The $H_2O_2$ solution may have a $H_2O_2$ concentration ranging from between about one weight percent (1 wt. %) to about ten weight percent (10 wt. %), such as between about three weight percent (3 wt. %) and about seven weight percent (7 wt. %). In some embodiments, the $H_2O_2$ solution includes between about three weight percent (3 wt. %) and about five weight percent (5 wt. %) $H_2O_2$.

The semiconductor structure 300 may be exposed to the $H_2O_2$ solution at a temperature of between about 20° C. and about 100° C., such as between about 25° C. and about 75° C. In some embodiments, the $H_2O_2$ solution is applied at a temperature of about room temperature (e.g., between about 20° C. and about 25° C.). In other embodiments, the $H_2O_2$ solution is applied at a temperature of about 65° C.

Referring to FIG. 3E, the aluminum oxide 324 remains on p-channel region 315 of the semiconductor structure 300 while no aluminum-containing material 327 is present on the n-channel region 305. Thus, the aluminum oxide 324 may be formed at a desired location on the semiconductor structure 300 and may be self-aligned without using an additional photolithography act to pattern the aluminum oxide 324. By eliminating the need for the additional photolithography act, the complexity and cost of the method of the present disclosure may be reduced compared to conventional techniques of forming and patterning aluminum oxide 324. In addition, the use of extra materials, such as a photoresist and BARC, is avoided. The methods of embodiments of the present disclosure may also enable reduction in the number of etch acts and etchants used. Since no photoresist and BARC are used, only a single etchant, aqueous $H_2O_2$, is needed, which further reduces the complexity and cost of the methods of embodiments of the present disclosure.

Figure 3F:
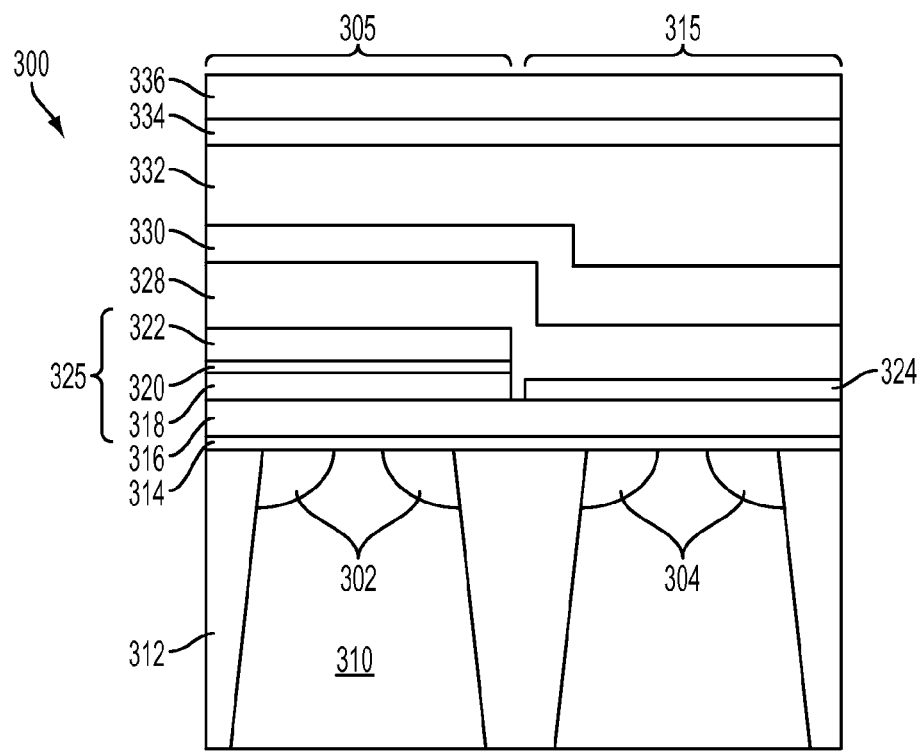

Referring to FIG. 3F, a conductive material 328 may be conformally formed over the semiconductor structure 300. The conductive material 328 may be formed over the second metal material 322 in n-channel region 305 and over the aluminum oxide 324 in p-channel region 315. The conductive material 328 may be formed by ALD, CVD, PECVD, LPCVD, PVD, or other deposition method. The conductive material 328 may have a thickness of between about 40 Å and about 60 Å, such as between about 45 Å and about 55 Å. In some embodiments, the thickness of the conductive material 328 is about 50 Å. The conductive material 328 may include a metal or a metal nitride. The conductive material 328 may include the same metal as the first metal material 318 or the second metal material 322. Thus, in some embodiments, the conductive material 328, the first metal material 318, and the second metal material 322 are the same material. In some embodiments, the conductive material 328 is titanium nitride.

With continued reference to FIG. 3F, a silicon material 330 may be formed over the conductive material 328. The silicon material 330 may be formed by suitable methods, such as PVD, ALD, CVD, PECVD, LPCVD, PVD, or other deposition methods. The silicon material 330 may have a thickness of between about 2 nm and about 10 nm, such as between about 3 nm and about 8 nm, and between about 4 nm and about 6 nm. In some embodiments, the silicon material 330 has a thickness of about 5 nm.

After the silicon material 330 is formed, a mask may be foimed over p-channel region 315. N-channel region 305 may be implanted with arsenic to form arsenic implanted regions (not shown) at an interface between the first metal material 318 and the capping material 320 and at an interface between the capping material 320 and the second metal material 322. After the arsenic implant is complete, the mask material may be removed from the semiconductor structure 300.

A polysilicon material 332 may be formed over the silicon material 330. The polysilicon material 332 may be doped with boron or doped with phosphorus. In some embodiments, the polysilicon material 332 is doped with phosphorus. The polysilicon material 332 may be formed by forming polysilicon and then doping with phosphorus, or the polysilicon material 332 may be formed in situ. In some embodiments, the polysilicon material 332 is formed in situ by including dopant gases such as phosphine or diborane in the deposition precursor gas recipe.

A second conductive material 334 may be formed over the polysilicon material 332. The second conductive material 334 may include a conductive metal such as copper, tungsten, aluminum, titanium, tantalum, platinum, alloys thereof, heavily doped semiconductor material, a conductive silicide, or combinations thereof. In some embodiments, the second conductive material 334 is tungsten.

A silicon nitride material 336 may overlie the second conductive material 334. The silicon nitride material 336 may be formed by a suitable deposition process, such as ALD, CVD, PECVD, LPCVD, PVD, or other deposition process.

Additional processing acts may be performed by conventional techniques to produce a complete semiconductor device, such as a CMOS device or DRAM memory cell, according to the desired end use of the semiconductor structure 300.

Accordingly, a method of forming a semiconductor structure is disclosed. The method comprises exposing a dielectric material and a metal nitride on a substrate to an aluminum precursor and an oxygen precursor to form aluminum oxide over the dielectric material and a metal-aluminum compound over the metal nitride. The aluminum oxide and the metal-aluminum compound are exposed to a solution comprising hydrogen peroxide.

Figure 4A:
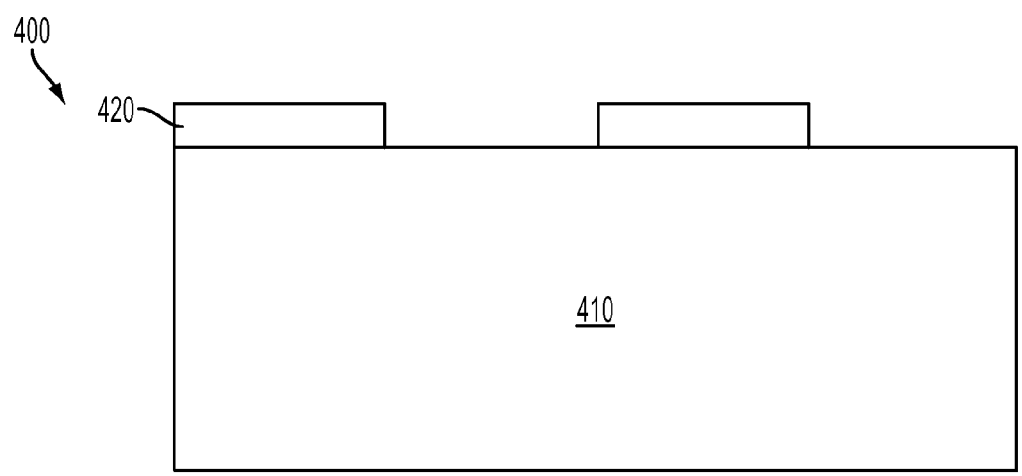
FIG. 4A through FIG. 4C are simplified cross-sectional views showing processing acts for forming an aluminum oxide material on a semiconductor structure according to other embodiments of the present disclosure.
Figure 4B:
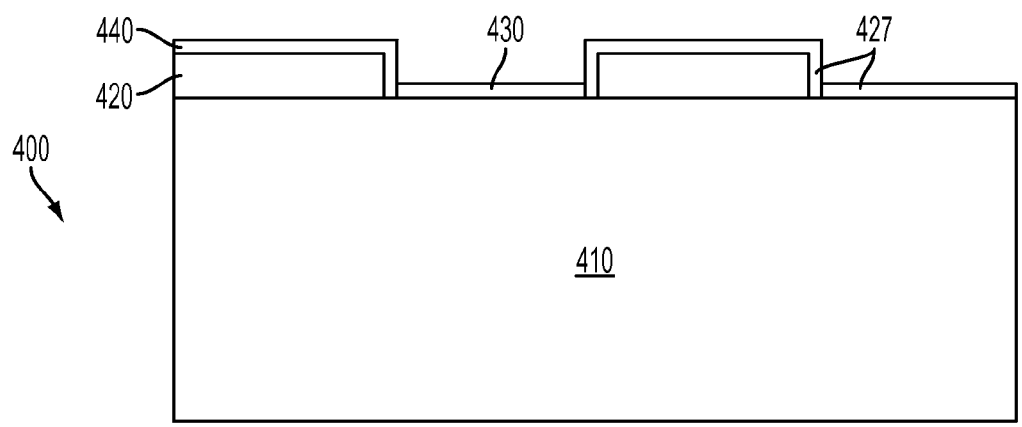
Figure 4C:
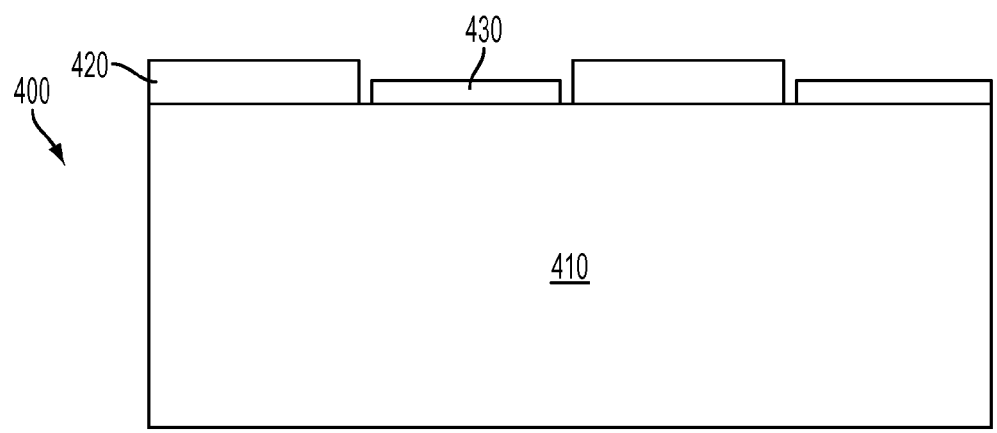

A method of forming a semiconductor structure 400 having an aluminum oxide material with a thickness less than about 20 Å, such as less than about 10 Å, is described with respect to FIG. 4A through FIG. 4C. Referring to FIG. 4A, titanium nitride 420 may be formed over a substrate 410. Although not shown, there may be intervening materials between the titanium nitride 420 and the substrate 410, such as at least one of a dielectric material, conductive material, work function modifier, or other materials. For example, a conductive material such as copper, tungsten, aluminum, titanium, tantalum, platinum, alloys thereof, heavily doped semiconductor material, a conductive silicide, or combinations thereof may underlie the titanium nitride 420. The titanium nitride 420 may be patterned with a photomask or a hardmask material by conventional techniques, which are not described in detail herein. Desired portions of the titanium nitride 420 may be removed through openings in the mask. For example, the titanium nitride 420 may be exposed to an aqueous solution of $H_2O_2$ or a solution of ammonium hydroxide. In some embodiments, the titanium nitride 420 is removed with an $H_2O_2$ solution at a rate of about 10 Å per minute.

Referring to FIG. 4B, an aluminum-containing material 427 may be conformally formed on the semiconductor structure 400. The substrate 410 (or intervening materials, if present) and the titanium nitride 420 may be exposed to the aluminum precursor and the oxygen precursor at a temperature of between about 200° C. and about 400° C., such as between about 250° C. and about 300° C., or between about 300° C. and about 350° C. The aluminum-containing material 427 includes a metal-aluminum compound 440 and aluminum oxide 430. In some embodiments, the temperature is about 300° C. Exposing the substrate 410 to the aluminum precursor and the oxygen precursor may form the aluminum oxide 430 over the substrate 410 and the metal-aluminum compound 440 over the titanium nitride 420. As previously described, the metal-aluminum compound 440 may be $AlTiN_yO_x$, where x is between one (1) and four (4) and y is between one-half (½) and two (2). In other embodiments, x is about 2.5 and y is about 0.8. The metal-aluminum compound 440 may comprise about nineteen atomic percent (19 at. %) of each of aluminum and titanium, about forty-seven atomic percent (47 at. %) of oxygen, and about fifteen atomic percent (15 at. %) of nitrogen.

In some embodiments, the aluminum-containing material 427 is formed by ALD. The aluminum-containing material 427 may be formed by performing between one ALD cycle and ten ALD cycles. For example, between one ALD cycle and five ALD cycles or between five ALD cycles and ten ALD cycles may be performed. The aluminum oxide 430 may have a thickness of between about 5 Å and about 15 Å, such as between about 5 Å and about 10 Å, or between about 10 Å and about 15 Å. The metal-aluminum compound 440 may have a thickness that is greater than the thickness of the aluminum oxide 430.

Referring to FIG. 4C, the metal-aluminum compound 440 may be removed by exposing the semiconductor structure 400 to a solution of $H_2O_2$, as described above with reference to FIG. 3E. For example, the metal-aluminum compound 440 may be removed by exposing the semiconductor structure 400 to a solution of between about three weight percent (3 wt. %) and about ten weight percent (10 wt. %) $H_2O_2$ for between about ten seconds and about three minutes. The aluminum oxide 430 may remain on the substrate 410. In some embodiments, additional processing acts may be performed to remove the titanium nitride 420 from the semiconductor structure 400. For example, the titanium nitride 420 may be removed at a rate of about 10 Å per minute by exposing the titanium nitride 420 to the $H_2O_2$ solution.

Thus, the resulting semiconductor structure 400 may include aluminum oxide 430 on desired portions of the substrate 410. In embodiments including intervening materials between the substrate 410 and the titanium nitride 420, the resulting semiconductor structure 400 may include the intervening materials.

Accordingly, a method of forming aluminum oxide is disclosed. The method comprises forming titanium nitride on portions of a substrate. A titanium-aluminum compound is formed over the titanium nitride and aluminum oxide is formed over the substrate. The titanium-aluminum compound and the aluminum oxide are exposed to hydrogen peroxide to remove the titanium-aluminum compound from over the titanium nitride.

Figure 5A:
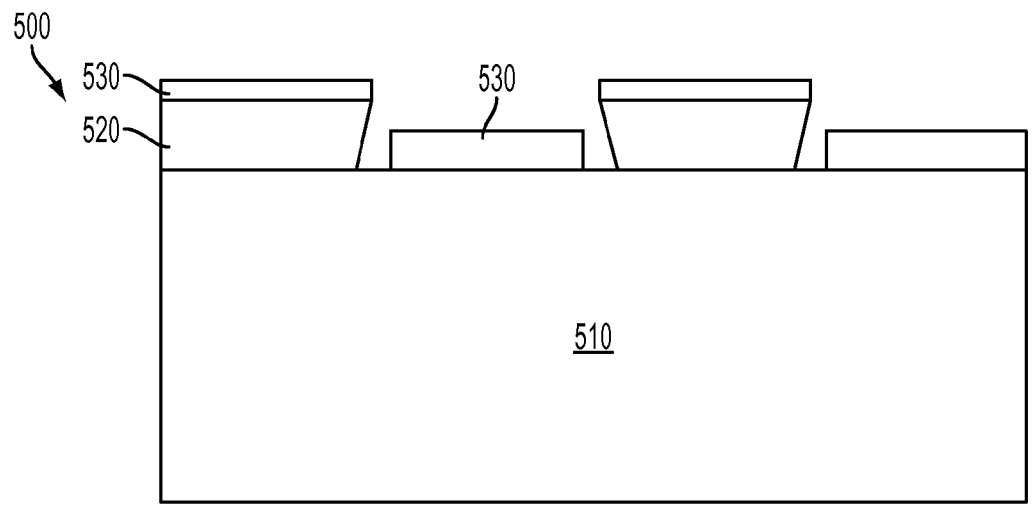
FIG. 5A and FIG. 5B are simplified cross-sectional views showing an aluminum oxide material on a semiconductor structure according to other embodiments of the present disclosure.

Referring to FIG. 5A, a method of forming an aluminum oxide comprising a thickness greater than about 10 Å, such as greater than about 20 Å, is described. Titanium nitride 520 may be patterned as described above with reference to FIG. 4A. The titanium nitride 520 and a substrate 510 may be exposed to precursors for forming aluminum oxide, such as an aluminum precursor and an oxygen precursor, to form aluminum oxide 530 over the substrate 510 and over the titanium nitride 520. The aluminum oxide 530 may be formed to a thickness greater than about 10 Å, such as up to about 30 Å, up to about 50 Å, or up to about 100 Å. Forming greater than about 20 Å of aluminum oxide 530 over a semiconductor structure 500 may form an aluminum oxide 530 over the titanium nitride 520 rather than an metal-aluminum compound 440 as described above with reference to FIG. 4B. Aluminum oxide 530 may not be formed over on the sidewalls of the titanium nitride 520.

Figure 5B:
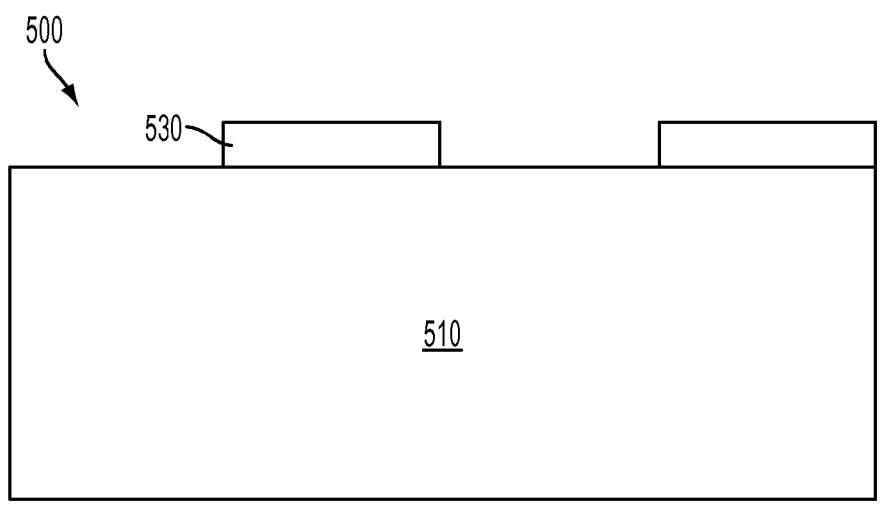

Referring to FIG. 5B, the titanium nitride 520 may be removed by exposing the semiconductor structure 500 to an $H_2O_2$ solution. The $H_2O_2$ solution may remove exposed portions of the titanium nitride 520, such as side portions extending above the aluminum oxide 530 in between the titanium nitride 520. Accordingly, a self-patterned aluminum oxide 530 having a thickness greater than approximately 10 Å may be formed. The aluminum oxide 530 between the titanium nitride 520 may have a thickness that is less than a thickness of the titanium nitride 520.

Accordingly, a method of forming an aluminum oxide material is disclosed. The method comprises subjecting exposed portions of a substrate and titanium nitride to an aluminum precursor and an oxygen precursor to form aluminum oxide on the exposed portions of the substrate and a titanium-aluminum compound on the exposed portions of the titanium nitride. The titanium-aluminum compound is removed from the titanium nitride.

In some embodiments, a self-aligned lanthanum oxide ($La_2O_3$) or magnesium oxide (MgO) may be formed by methods similar to the above disclosed methods of forming aluminum oxide. For example, a semiconductor structure may comprise exposed portions of a metal nitride and exposed portions comprising another material. The semiconductor structure may be exposed to a lanthanum precursor and an oxygen precursor to form a metal-lanthanum compound over the metal nitride and lanthanum oxide over the other exposed portions of the semiconductor structure. The metal-lanthanum compound and the lanthanum oxide may be formed by ALD, CVD, PECVD, LPCVD, PVD, or other deposition process. Where the metal nitride comprises titanium nitride, the metal-lanthanum compound may comprise lanthanum, titanium, nitrogen, and oxygen atoms, and may exhibit a different etch rate than the lanthanum oxide upon exposure to various etchants. Similarly, a metal-magnesium compound may be formed over a metal nitride and a magnesium oxide may be formed over other exposed portions of a semiconductor structure by exposing the semiconductor structure to a magnesium precursor and an oxygen precursor. The magnesium oxide may be formed by ALD, CVD, PECVD, LPCVD, PVD, or other deposition process. Where the metal nitride of the semiconductor structure comprises titanium nitride, a titanium-magnesium compound comprising magnesium, titanium, nitrogen, and oxygen may be formed over the titanium nitride and magnesium oxide may be fomied over other exposed portions of the semiconductor structure.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure as contemplated by the inventors.

What is claimed is:

1. A method of forming a semiconductor structure, the method comprising:
   exposing a dielectric material and a metal nitride on a substrate to an aluminum precursor and an oxygen precursor to form aluminum oxide over the dielectric material and a metal-aluminum compound over the metal nitride; and
   exposing the aluminum oxide and the metal-aluminum compound to a solution comprising hydrogen peroxide.

2. The method of claim 1, wherein exposing a dielectric material and a metal nitride on a substrate to an aluminum precursor and an oxygen precursor comprises exposing a dielectric material comprising hafnium oxide to the aluminum precursor and the oxygen precursor.

3. The method of claim 1, wherein exposing a dielectric material and a metal nitride on a substrate to an aluminum precursor and an oxygen precursor comprises exposing the dielectric material and the metal nitride to the aluminum precursor and the oxygen precursor at a temperature of between about 300° C. and about 350° C.

4. The method of claim 1, wherein exposing a dielectric material and a metal nitride to an aluminum precursor comprises exposing the dielectric material and the metal nitride to tri-methyl aluminum (TMA).

5. The method of claim 1, wherein exposing a dielectric material and a metal nitride to an oxygen precursor comprises exposing the dielectric material and the metal nitride to at least one of oxygen, ozone, and water.

6. The method of claim 1, wherein exposing the aluminum oxide and the metal-aluminum compound to a solution comprising hydrogen peroxide comprises exposing the aluminum oxide and the metal-aluminum compound to a solution comprising between about one weight percent (1 wt. %) hydrogen peroxide and about ten weight percent (10 wt. %) hydrogen peroxide.

7. The method of claim 1, wherein exposing the aluminum oxide and the metal-aluminum compound to a solution comprising hydrogen peroxide comprises removing the metal-aluminum compound from over the metal nitride while leaving the aluminum oxide on the dielectric material.

8. The method of claim 1, wherein exposing a dielectric material and a metal nitride on a substrate to an aluminum precursor and an oxygen precursor comprises exposing the dielectric material and the metal nitride on the substrate to an atomic layer deposition aluminum precursor and an atomic layer deposition oxygen precursor.

9. A method of forming aluminum oxide, the method comprising:
    forming titanium nitride on portions of a substrate;
    forming a titanium-aluminum compound over the titanium nitride and forming aluminum oxide over the substrate; and
    exposing the titanium-aluminum compound and the aluminum oxide to hydrogen peroxide to remove the titanium-aluminum compound from over the titanium nitride.

10. The method of claim 9, wherein forming titanium nitride on portions of a substrate comprises forming the titanium nitride over the substrate, forming openings in a mask material over the titanium nitride, and removing portions of the titanium nitride through the mask material.

11. The method of claim 9, wherein forming a titanium-aluminum compound over the titanium nitride comprises forming a compound comprising aluminum, titanium, oxygen, and nitrogen atoms over the titanium nitride.

12. The method of claim 9, wherein forming aluminum oxide comprises forming the aluminum oxide to have a thickness greater than about 10 Å.

13. The method of claim 9, wherein forming titanium nitride and forming aluminum oxide comprises forming the titanium nitride to have a greater thickness than a thickness of the aluminum oxide.

14. The method of claim 9, wherein exposing the titanium-aluminum compound and the aluminum oxide to hydrogen peroxide comprises exposing the titanium-aluminum compound and the aluminum oxide to hydrogen peroxide for between about thirty seconds and about one minute.

15. The method of claim 9, further comprising forming a conductive material over the aluminum oxide and the titanium nitride.

16. A method of forming an aluminum oxide material, the method comprising:
    subjecting exposed portions of a substrate and exposed portions of titanium nitride to an aluminum precursor and an oxygen precursor to form aluminum oxide on the exposed portions of the substrate and a titanium-aluminum compound on the exposed portions of the titanium nitride; and
    removing the titanium-aluminum compound from the titanium nitride.

17. The method of claim 16, wherein forming a titanium-aluminum compound on the exposed portions of the titanium nitride comprises forming the titanium-aluminum compound to a thickness of between about 10 Å and about 20 Å.

18. The method of claim 16, wherein forming aluminum oxide on the exposed portions of the substrate comprises forming aluminum oxide on the exposed portions of the substrate to a thickness of between about 1 Å and about 10 Å.

19. The method of claim 16, wherein removing the titanium-aluminum compound from the titanium nitride comprises exposing the aluminum oxide and the titanium-aluminum compound to a solution comprising hydrogen peroxide.

20. The method of claim 16, further comprising removing the titanium nitride after removing the titanium-aluminum compound.

* * * * *

UNITED STATES PATENT AND TRADEMARK OFFICE
CERTIFICATE OF CORRECTION

| | |
|---|---|
| PATENT NO. | : 9,129,798 B1 |
| APPLICATION NO. | : 14/184452 |
| DATED | : September 8, 2015 |
| INVENTOR(S) | : Difeng Zhu |

It is certified that error appears in the above-identified patent and that said Letters Patent is hereby corrected as shown below:

On the title page:

In ITEM (65):    immediately below:
(22)   Filed:   Feb. 19, 2014 insert:
--(65)        Prior Publication Data
   US   2015/0235841 A1   Aug. 20, 2015--

Signed and Sealed this
Twenty-second Day of March, 2016

Michelle K. Lee
*Director of the United States Patent and Trademark Office*